United States Patent [19]
Dekker et al.

[11] 4,236,226
[45] Nov. 25, 1980

[54] MAGNETIC DOMAIN DEVICE

[75] Inventors: Evert H. L. J. Dekker; Ulrich E. Enz; Jan Haisma; Klaas L. L. Van Mierloo, all of Eindhoven, Netherlands

[73] Assignee: U.S. Philips Corporation, New York, N.Y.

[21] Appl. No.: 15,981

[22] Filed: Feb. 26, 1979

Related U.S. Application Data

[63] Continuation of Ser. No. 823,406, Aug. 10, 1977, abandoned.

[30] Foreign Application Priority Data

Aug. 27, 1976 [NL] Netherlands ......................... 7609528

[51] Int. Cl.³ ............................................ G11C 19/08
[52] U.S. Cl. ......................................... 365/20; 365/41
[58] Field of Search ........................ 365/19, 20, 39, 41

[56] References Cited

U.S. PATENT DOCUMENTS

| | | | |
|---|---|---|---|
| 3,631,413 | 6/1970 | Copeland | 365/20 |
| 3,701,129 | 10/1972 | Copeland | 365/19 |
| 3,893,089 | 7/1975 | Almasi et al. | 365/19 |
| 4,027,296 | 5/1977 | Suchtelen | 365/14 |

OTHER PUBLICATIONS

IBM Technical Disclosure Bulletin, vol. 17, No. 5, Oct. 1974, p. 1535.

*Primary Examiner*—James W. Moffitt
*Attorney, Agent, or Firm*—Marc D. Schechter

[57] ABSTRACT

A magnetic device comprising at least one thin domain layer of a magnetizable material which has an easy axis of magnetization which is substantially normal to the surface of the layer and in which magnetic domains are propagated under the influence of a bipolar current, for example an alternating current, by a pattern of electrically conductive material with which the layer is provided. Elements are furthermore present which cause an asymmetry force and thus determine the direction in which the domains are propagated. The electrically conductive material and the elements are present in a single pattern which is constructed from at least a layer of magnetic material.

6 Claims, 15 Drawing Figures

MAGNETIC DOMAIN DEVICE

This is a continuation of application Ser. No. 823,406, filed Aug. 10, 1977, now abandoned.

BACKGROUND OF THE INVENTION

The invention relates to a magnetic device comprising at least one thin magnetic domain layer of a magnetizable material which has an easy axis of magnetization which is substantially normal to the surface of the layer, which layer has a pattern of electrically conductive material and elements which cause an asymmetry force, and furthermore comprising bipolar current-supplying means for propagating magnetic domains in the layer in cooperation with the pattern of electrically conductive material.

In such a device which is known from Journal of Applied Physics, Vol. 42, No. 4, Mar. 15, 1971, pp. 1266–1267, the thin layer of magnetizable material has a pattern of electrically conductive material in a first configuration. The elements which cause an asymmetry force which is necessary to determine the direction in which the magnetic domains propagate are formed by a pattern of dots of soft-magnetic material in a second configuration. If such elements which cause an asymmetry force were not present, then it would be possible to propagate the magnetic domains under the influence of a bipolar current, for example an alternating current, from a first to a second position, but it could not be determined beforehand which second position that is. In other words, the direction in which the propagation occurs would then be indefinite.

During the manufacture of the device, two patterns are provided one after the other by means of mask technology, the critical dimension being the radius of the magnetic domains. This requires that in order to provide the second pattern, the relevant mask has to be aligned very accurately with respect to the first pattern. As a result of this, size restrictions arise, in particular relating to the dimensions of the magnetic domains. These restrictions also occur in other known embodiments of the elements which cause an asymmetry force, for example, a second pattern of electrically conductive material over the first pattern of the same configuration but shifted over a small distance relative thereto, or a groove of variable width etched in the thin layer of magnetizable material.

SUMMARY OF THE INVENTION

These restrictions do not occur in the device according to the invention. For that purpose, the layer magnetic domain of magnetizable material has, built up thereon a single propagation pattern of electrically conductive material and the elements which cause the asymmetry force, and which pattern is built up of at least a propagation layer of magnetic material. Since the propagation layer has a single configuration, it is possible to realize the manufacture hereof by means of one mask. In addition, the advantage of this structure is that the position of the magnetic domains is better stabilized, due to the presence of the propagation layer of magnetic material in the configuration, than in the known devices (i) by means of dots of soft-magnetic material, (ii) by means of a second pattern of electrically conductive material shifted over a small distance with respect to the first pattern, or (iii) by means of an etched groove of variable width. In the case of two patterns of electrically conductive material, no stabilization at all of the position of the magnetic domains takes place when the current through said conductors is switched off.

For the case of a single pattern of electrically conductive material and the elements which cause the asymmetry force and which pattern contains at least a layer of magnetic material, according to the invention, there exist a number of different embodiments.

In a first embodiment the layer of magnetizable material has been provided with a single pattern in one propagation layer consisting of electrically conductive soft magnetic material. The pattern comprises the elements which cause the asymmetry force. The elements cause said asymmetry force due to the fact that the material of the pattern is soft magnetic, namely it becomes magnetized under the influence of the field of the magnetic domains, and also due to the positions of the elements with respect to the propagation pattern. With respect to the positions of the elements there are two possibilities. Either they are separated from the pattern or they are connected to the pattern. In this latter case the propagation pattern comprises certain elements which cause the asymmetry force. This asymmetry may reside in particular in the absence of a certain mirror symmetry in the pattern.

In a second embodiment, the domain layer of magnetizable material has been provided with a single pattern comprising a sub-layer of electrically conductive material and a sub-layer of soft magnetic material. The asymmetry is caused in this case by the relevant parts of the layer consisting of soft magnetic material under the influence of a magnetic field generated by the alternating current through the sub-layer consisting of electrically conductive material and under the influence of the magnetic domains. In addition, the soft magnetic material may be electrically conductive. Furthermore, the two sub-layers of the pattern may be separated by an adhesive layer or by an electrically insulating layer. With respect to the positions of the elements there are again two possibilities. Either they are separated from the pattern or they are connected to the pattern. In this latter case the propagation pattern comprises certain elements which cause the asymmetry force.

In the first embodiment, the elements consisting of soft-magnetic material cause an asymmetry force under the influence of the field of the magnetic domains; in the second embodiment, the elements consisting of soft-magnetic material cause an asymmetry force under the influence of a magnetic field generated by the alternating current through the sub-layer consisting of electrically conductive material and under the influence of the magnetic domains. In these two embodiments it is particularly favorable to create the asymmetry force by applying, to the elements, an external magnetic field in the plane of the magnetizable layer. Said external magnetic field need be present only at the instant at which the asymmetry force must be present, that is to say immediately prior to and at the beginning of the propagation of the magnetic domains. In this embodiment the propagation of the magnetic domains is only in an approximately straight line and not in curves or return lines. In addition it is favorable to use the externally applied magnetic field to change a forward movement of the magnetic domains if desired into a backward movement. Therefore, the magnetic device comprises, in particular, means to generate a magnetic field in the plane of the magnetizable layer.

In a third embodiment, the layer of magnetizable material has been provided with a single pattern of electrically conductive material, which pattern comprises a sub-layer consisting of electrically conductive material and a sub-layer consisting of permanent magnetizable material. The elements which cause an asymmetry force are formed in this case by the sub-layer consisting of permanent magnetizable material which is magnetized in a given direction in the plane of the layer, such that a component of the magnetization is in the direction of propagation of the magnetic domains.

BRIEF DESCRIPTION OF THE DRAWINGS

The invention will now be described in greater detail, by way of example, with reference to the drawing, in which.

DESCRIPTION OF THE PREFERRED EMBODIMENTS

Figure 1:
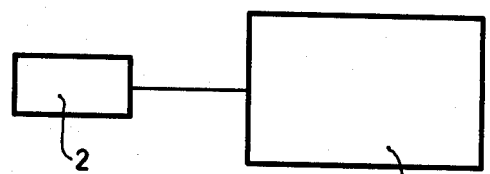
FIG. 1 shows the device diagrammatically.

FIG. 1 shows diagrammatically a device according to the invention of which a component 1 comprises at least one thin layer of magnetizable material, which device furthermore comprises a component 2 having means to supply an alternating current.

Figure 2:
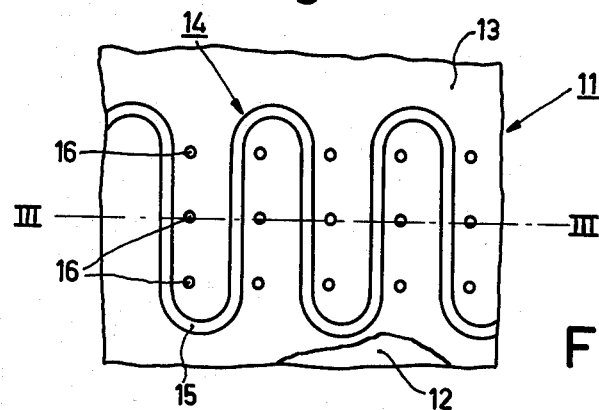
FIG. 2 is a plan view of a part of the device.
Figures 3A, 3B:
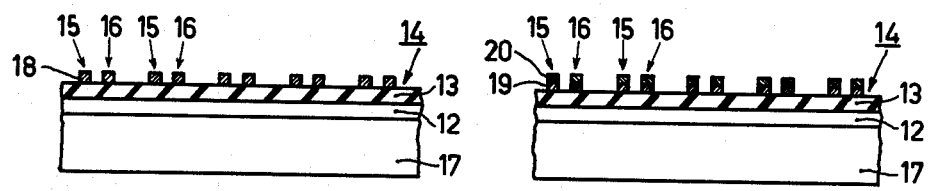
FIGS. 3a and 3b are two different diagrammatic sectional views taken on the line III—III of FIG. 2.

FIG. 2 shows a part 11 of a plan view, partly broken away, of the component 1, namely a device in which magnetic domains are propagated. Visible in FIG. 2 are a magnetic domain layer 12, a spacer layer 13 and furthermore a propagation pattern 14 comprising meander 15 and dots 16 which cause an asymmetry force. Said propagation pattern comprises a layer of magnetic material, namely a layer of soft-magnetic material. FIGS. 3a and 3b are two sectional views of two different embodiments of the pattern 14.

FIG. 3a is a diagrammatic sectional view taken on the line III—III of FIG. 2. The magnetizable domain layer 12 is present on a substrate 17 and has an easy axis of magnetization which is approximately normal to the surface of the layer. The spacer layer 13 is situated on the magnetizable layer 12. The propagatin pattern 14, comprising the meander 15 and the dots 16, consists of a propagation layer 18 of electrically conductive soft magnetic material.

The substrate 17, for example, consists of gadolinium-gallium garnet, and the magnetizable layer 12, having a thickness of 5 $\mu$m, consists of $Sm_{0.3}Y_{2.7}Ga_{1.2}Fe_{3.8}O_{12}$. The spacer layer 13 has a thickness of 7000 Å and consists of $SiO_x$, where x is approximately 2. The layer 18 has a thickness of 0.4 $\mu$m and consists of nickel iron with 80 at.% Ni and 20 at.% Fe.

FIG. 3b is a diagrammatic sectional view taken on the line III—III of FIG. 2 of a differently constructed propagation pattern 14. The magnetizable layer 12 is situated on the substrate 17. The spacer layer 13 is situated on the magnetizable layer 12. The propagation pattern 14 comprising the meander 15 and the dots 16, is constructed from a propagation layer comprising sub-layer 19 of electrically conductive material and a sub-layer 20 of soft-magnetic material, for example nickel-iron with 80 at.% Ni and 20 at.% Fe.

The substrate 17, for example, consists of gadolinium-gallium garnet and a magnetizable layer 12 having a thickness of 5 $\mu$m consists of $Sm_{0.3}Y_{0.7}Ga_{1.2}Fe_{3.8}O_{12}$. The spacer layer 13 has a thickness of 4000 Å and consists of $SiO_x$, where x is approximately 2. The sub-layer 19 has a thickness of 0.3 $\mu$m and consists of aluminum. The sub-layer 20 has a thickness of 0.2 $\mu$m and consists of nickel iron with 80 at.% Ni and 20 at.% Fe. A 0.07 $\mu$m thick adhesive layer consisting of molybdenum is present between the layers 19 and 20.

Figure 4:
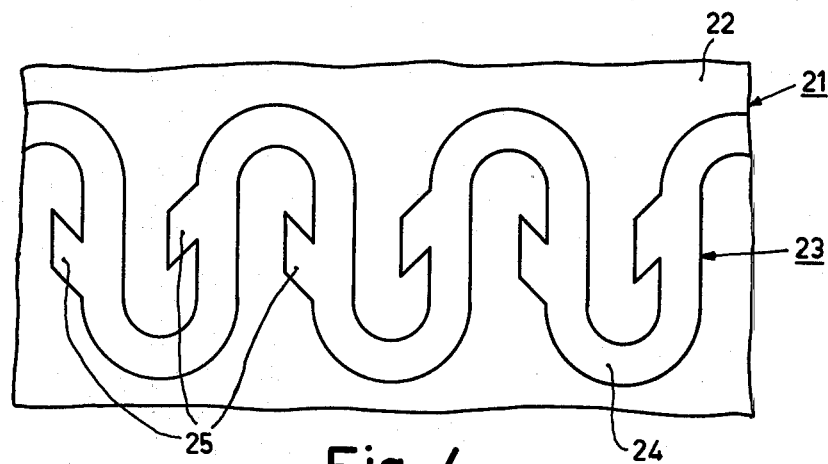
FIG. 4 is a plan view of a differently constructed part of the device.

FIG. 4 shows a part 21 of a plan view of a differently constructed component 1, namely a device in which magnetic domains are propagated. Visible in FIG. 4 are a spacer layer 22 below which is present a magnetizable layer, not visible, and furthermore a propagation pattern 23 comprising meander 24 which causes the lateral propagation of the magnetic domains, and also comprising the elements 25, which cause the asymmetry force to determine the direction of propagation. This pattern comprises a layer of magnetic material, namely a layer of soft magnetic material. As in the pattern shown in FIG. 2, of which FIGS. 3a and 3b are sectional views of different constructions, the pattern 23 may consist of a layer of electrically conductive soft magnetic material, or the pattern 23 may be constructed from a sub-layer of electrically conductive material and a sub-layer of soft magnetic material.

Figures 5A, 6A:
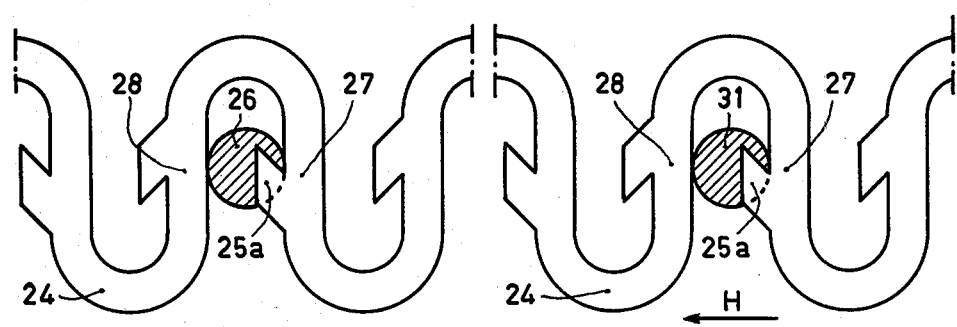
FIGS. 5a, 5b and 5c show successive positions of a propagating magnetic domain.
FIGS. 6a, 6b and 6c also show successive positions of an oppositely propagating magnetic domain.
Figures 5B, 6B:
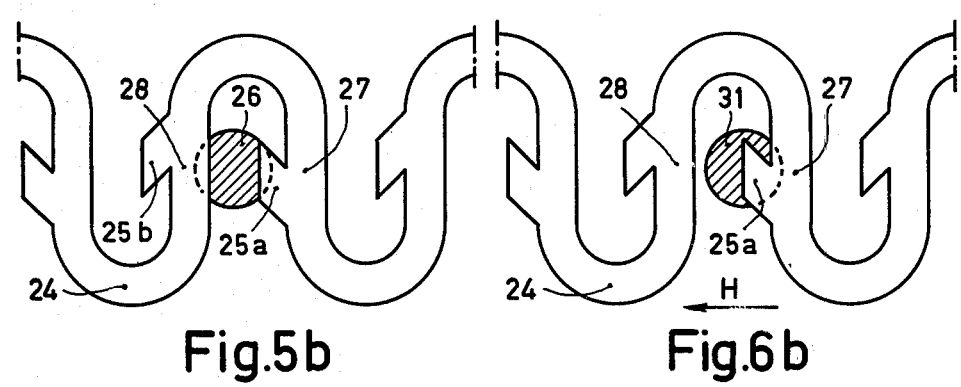
Figures 5C, 6C:
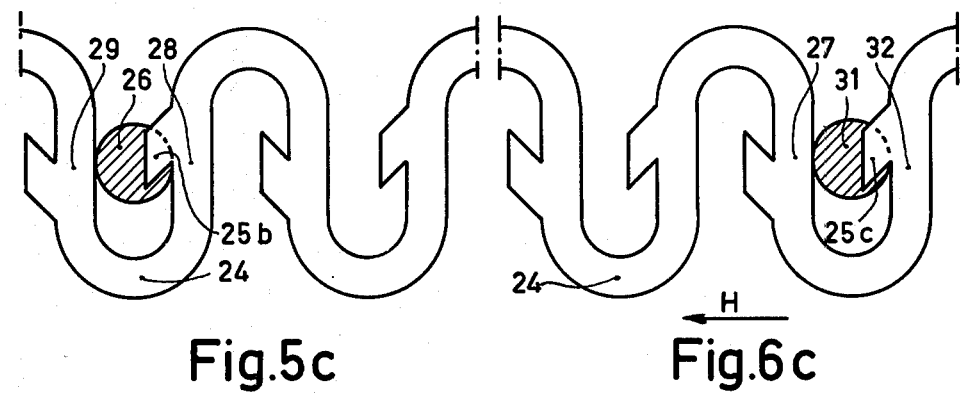

FIGS. 5a, 5b and 5c show successive positions of a magnetic domain in the pattern of FIG. 4 under the influence of an alternating current through the electrically conductive parts of the meander 24. The alternating current is represented by $i = i_o \sin \omega t$. In FIG. 5a Sin $\omega t = 1$. A magnetic domain 26 is situated in the magnetizable domain layer substantially between two successive straight parts 27 and 28 of the meander 24 as a result of the fact that the magnetic force generated by the current $i = i_o$ which flows substantially entirely through the meander-shaped part and substantially not through the elements 25 is larger than the asymmetry force caused by the soft magnetic part of the element 25a. In FIG. 5b Sin $\omega t = 0$. The magnetic domain 26 is now displaced over a small distance, namely so that the centre of the magnetic domain 26 is substantially centrally between the straight part 28 and the element 25a as a result of the magnetic interaction between the domain 26 and on one side the soft magnetic parts of the straight part 27 and the element 25a and on the other side the soft magnetic parts of the straight part 28 and the element 25b. In FIG. 5c Sin $\omega t = -1$. The magnetic domain 26 has now been further propagated and is situated substantially between two successive straight parts 28 and 29 of the meander 24 under the influence of the magnetic force generated by the current $i = -i_o$ analogous to the situation in FIG. 5a. From FIGS. 5a, 5b and 5c it appears how the magnetic domain 26 is propagated under the influence of an alternating current $i = i_o \sin \omega t$, in which the elements 25a and 25b cause an asymmetry force.

Figure 7:
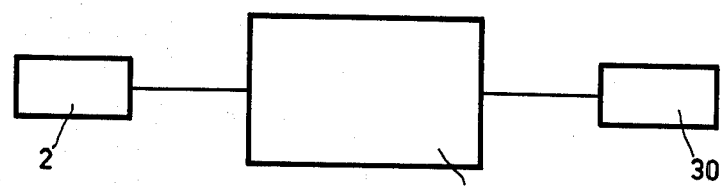
FIG. 7 shows diagrammatically another construction of the device.

FIG. 7 shows diagrammatically a device according to the invention, which, in addition to the component 1 and the component 2, comprises a component 30 having means to provide a magnetic field in the plane of the magnetizable layer. If in this case the component 1 is constructed as shown in FIG. 4, then FIGS. 6a, 6b and 6c show the successive positions of a magnetic domain under the influence of an alternating current through the electrically conductive part of the meander 24 and of a magnetic field II in the plane of the magnetizable layer. The alternating current is represented again by $i = i_o \sin \omega t$. In FIG. 6a $\sin \omega t = 1$. A magnetic domain 31 is present in the magnetizable layer substantially between two successive straight parts 27 and 28 of the meander 24 as a result of the fact that the magnetic force generated by the current $i = i_o$ which flows substantially entirely through the meander-shaped part and substantially not through the elements 25, is larger than the symmetry force caused by the soft magnetic part of the element 25a. In FIG. 6b $\sin \omega t = 0$. The magnetic domain 31 has now been propagated over a small distance, namely so that the center of the magnetic domain 31 is situated substantially on the edge of the element 25a as a result of the attractive magnetic force between the domain 31 and the soft magnetic part of the straight part 27 and the element 25a, which attracting force, as a result of the magnetic field H, is larger than in the case of FIG. 5b. In FIG. 6c $\sin \omega t = -1$. The magnetic domain 31 has now been further propagated and is situated substantially between two successive straight parts 27 and 32 of the meander 24 as a result of the fact that the magnetic force generated by the current $i = -i_o$ is larger than the asymmetry force caused by the soft magnetic part of the element 25c. It thus appears from FIGS. 6a, b and c how the magnetic domain 31 in the magnetizable layer is propagated under the influence of an alternating current $i = i_o \sin \omega t$ and of the magnetic field H, the elements 25 causing an asymmetry force, and how said propagation differs from that shown in FIGS. 5a, b and c.

The component 30 of FIG. 7 may be advantageously constructed so as to also generate a magnetic field rotating in the plane of the magnetizable layer. Different from the propagation of magnetic domains as described so far under the influence of an alternating current through a pattern of electrically conductive material, it is possible to propagate magnetic domains under the influence of a magnetic field rotating in the plane of the magnetizable layer and cooperating with a magnetizable material present on said layer in a pattern suitable for that purpose. In the case of a device in which both types of propagation mechanisms are used, it is possible to use the same coils to generate the magnetic field rotating in the plane of the magnetizable layer and the magnetic field which is situated in the plane of said layer and which does not change direction.

Figure 8:
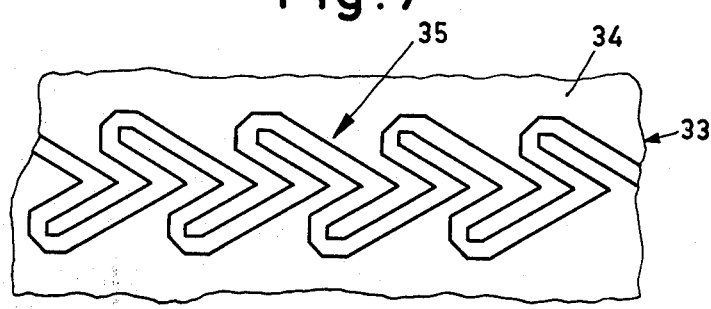
FIG. 8 is a plan view of a part of yet another construction of the device.

FIG. 8 shows a part 33 of a plan view of a differently constructed component 1, namely a device in which magnetic domains are propagated. Visible in FIG. 8 are a spacer layer 34 below which a magnetizable layer, not visible, is situated and furthermore a propagation pattern 35 which has an asymmetrical shape. Said pattern comprises a layer of magnetic material, namely a layer of soft magnetic material. The magnetic domains move under the influence of an alternating current through the electrically conductive part of the configuration from the right to the left. Normal to the direction of propagation no mirror face can be defined which transforms the parts of the pattern on either side of said face into each other. Consequently the pattern 35 comprises an asymmetric element. As in the patterns shown in FIGS. 2 and 4, the pattern 35 may consist of a layer of electrically conductive, soft magnetic material or the pattern 35 may be constructed from a sub-layer of electrically conductive material and a sub-layer of soft magnetic material.

Figure 9:
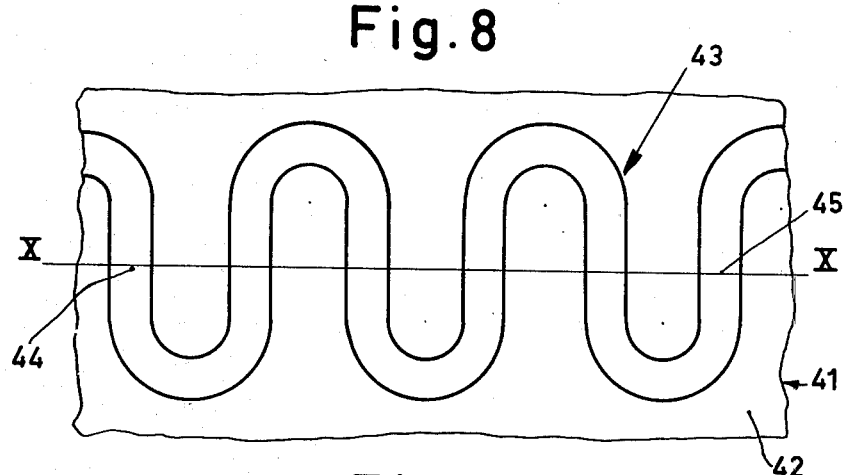
FIG. 9 is a plan view of a differently constructed part of the device.

FIG. 9 shows a part 41 of a plan view of still a differently constructed component 1, namely a device in which magnetic domains are propagated. Visible in FIG. 9 are a spacer layer 42 below which a magnetizable layer, not visible, is situated, and furthermore a pattern 43 in the form of a meander. This pattern comprises a layer of magnetic material, namely a layer of permanent magnetizable material which is magnetized parallel to the line 44–45, the line of propagation, or is magnetized so that a component is present parallel to the line 44–45.

Figure 10:
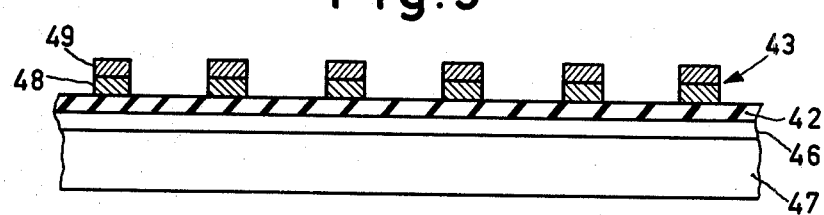
FIG. 10 is a diagrammatic sectional view taken on the line X—X in FIG. 9.

FIG. 10 is a diagrammatic sectional view taken on the line X—X of FIG. 9. A magnetizable layer 46 is situated on a substrate 47 and has an easy axis of magnetization which is approximately normal to the surface of the layer 46. The pattern 43 is constructed from a sub-layer 48 of electrically conductive material, for example, aluminium, and a sub-layer 49 of permanent magnetizable material, for example cobalt with 2% phosphorus.

What is claimed is:

1. A device for propagating magnetic domains comprising:
    a first thin magnetic domain layer of a magnetizable material having an easy axis of magnetization which is substantially normal to the surface of the layer;
    a single propagation pattern of electrically conductive material, of magnetic material, and of elements which cause an asymmetry force, said pattern comprising at least one propagation layer of material built up from the first layer of magnetizable material; and
    bipolar current-supplying means, electrically communicating with the pattern of electrically conductive material, for propagating magnetic domains in the first layer.

2. A device for propagating magnetic domains, as claimed in claim 1, wherein the propagation layer comprises a single layer of electrically conductive, soft magnetic material.

3. A device for propagating magnetic domains, as claimed in claim 1, wherein the propagation layer comprises a sub-layer of electrically conductive material and a sub-layer of soft magnetic material, one of said sub-layers being sandwiched between the first layer of magnetizable material and the other of said sub-layers.

4. A device for propagating magnetic domains, as claimed in claim 2 or 3, further comprising means for generating a magnetic field in the plane of the first magnetizable layer, said field having a component parallel to the line of propagation of the magnetic domains, whereby said field creates an asymmetry force in cooperation with the elements which cause an asymmetry force.

5. A device for propagating magnetic domains, as claimed in claim 1, wherein the propagation layer comprises a single layer of electrically conductive, permanent magnetic material.

6. A device for propagating magnetic domains, as claimed in claim 1, wherein the propagation layer comprises a sub-layer of electrically conductive material and a sub-layer of permanent magnetic material, one of said sub-layers being sandwiched between the first layer of magnetizable material and the other of said sub-layers.

* * * * *